United States Patent [19]

Garcia

[11] Patent Number: 4,682,059
[45] Date of Patent: Jul. 21, 1987

[54] COMPARATOR INPUT STAGE FOR INTERFACE WITH SIGNAL CURRENT

[75] Inventor: Carlos M. Garcia, Palm Bay, Fla.

[73] Assignee: Harris Corporation, Melbourne, Fla.

[21] Appl. No.: 793,316

[22] Filed: Oct. 31, 1985

[51] Int. Cl.[4] .............................................. H03F 3/18
[52] U.S. Cl. .................................... 307/496; 307/270; 307/491; 307/494; 307/255; 330/257; 330/267
[58] Field of Search ............... 307/491, 494, 496, 254, 307/255, 270; 330/257, 267, 288

[56] References Cited

U.S. PATENT DOCUMENTS

| | | | |
|---|---|---|---|
| 3,502,905 | 3/1970 | Bicking | 307/235 |
| 3,508,073 | 4/1970 | Everly et al. | 307/231 |
| 3,509,372 | 4/1970 | Bicking | 307/236 |
| 4,152,662 | 5/1979 | Sakai et al. | 330/257 X |
| 4,251,743 | 2/1981 | Hareyama | 307/297 |
| 4,433,303 | 2/1984 | Sasaki | 330/288 X |
| 4,446,443 | 5/1984 | Johnson et al. | 330/257 |
| 4,523,105 | 6/1985 | Jose et al. | 330/257 X |
| 4,536,662 | 8/1985 | Fujii | 307/297 X |
| 4,540,951 | 9/1985 | Ozawa et al. | 330/267 |
| 4,573,019 | 2/1986 | Yamada | 330/288 X |
| 4,591,739 | 5/1986 | Nagano | 330/288 X |

Primary Examiner—Stanley D. Miller
Assistant Examiner—D. R. Hudspeth
Attorney, Agent, or Firm—Barnes & Thornburg

[57] ABSTRACT

A current interface has an impedance buffering circuit which maintains a very low input impedance at an input node, while producing currents to two current outputs which increase and decrease, respectively, with increases and decreases in the input current flow. In a preferred embodiment, the impedance buffering circuit is an operational amplifier which has been modified to provide access to the collector terminals of a complementary output transistor pair. The collector terminals are connected to current mirrors which are also connected to an output node of the interface circuit. The amplifier and current mirrors effectively buffer the input and reconstruct changes in the input current at the output node, while maintaining a very low input impedance at the input node. Compensation for errors introduced by the changes in base currents of the complementary output pair is provided by a matching pair of complementary transistors.

31 Claims, 6 Drawing Figures

COMPARATOR INPUT STAGE FOR INTERFACE WITH SIGNAL CURRENT

BACKGROUND AND SUMMARY OF THE INVENTION

This invention relates generally to a current interface circuit and, more specifically, to a current interface circuit which is particularly well-suited for use as an input stage to a high speed comparator.

Very high speed comparators are essential to the realization of devices such as fast and accurate successive approximation A to D converters. One approach to a 12-bit A to D converter utilizes a fast voltage comparator, an SAR (successive approximation register), and a high speed D to A converter. A conventional 12-bit converter of this type is shown in FIG. 1 of the article entitled "A Fast Latching Current Comparator for 12-Bit A/D Applications" by Paul A. Crolla, IEEE Journal of Solid-State Circuits, Vol. SC-17, No. 6., Dec. 1982. This figure is reproduced as FIG. 1 in this disclosure.

Presently available voltage comparators have a response time on the order of 48 nanoseconds for 0.5 LSB overdrive. However, the speed of the overall SAR loop is hampered by the capacitance ($C_x$ in FIG. 1) present at the comparator input. In a typical 12-bit system which employs a conventional voltage comparator, the total stray capacitance (typically 30 picofarads) together with the 2500 ohm conversion resistor sets up a time constant which can introduce unwanted time delays into the loop. In order to reduce this delay, Schottky diodes are often placed across the input terminals to clamp or limit the voltage excursion at the input nodes.

An alternative approach involves the use of a current, rather than voltage, comparator as the polarity discriminator. A converter utilizing this approach is shown in FIG. 2 of the above-mentioned article and is reproduced as FIG. 2 of this Specification. The input terminal of a current comparator is sensitive to signal current rather than voltage changes and, accordingly, has a low input impedance. Due to the low input impedance, voltage excursions at the input node are minimal and the impact of the delay attributable to the capacitance at the input node may be reduced by an order of magnitude. Furthermore, a current detecting polarity discriminator is a logical interface to a current output DAC converter and the need for Schottky diode clamps at the input node may be eliminated.

Accordingly, an object of the present invention is to provide a current interface circuit which may be used as the input stage in a current comparator to discriminate the polarity of input signal current while maintaining a low impedance at the input node.

Another object of the present invention is to provide an input circuit for use in a comparator which eliminates the need for clamp circuitry at the input node.

Yet another object of the present invention is to provide a circuit for use as the input stage of a comparator to virtually eliminate attenuation of the input signal due to the use of external application resistors to provide for preferential offsets (e.g., the bipolar mode in an A to D converter application).

These and other objects are attained in accordance with the present invention by a current interface circuit which includes an impedance buffering circuit which maintains a very low impedance at an input node, and which has first and second current outputs. The impedance buffering circuit produces an increase in current flow at the first current output and a decrease in current flow at the second current output in response to a change in magnitude of the input current flow. Circuitry connected to the current outputs of the buffer compensates for errors which would otherwise be introduced by the buffer circuitry and reflects the input current changes to a circuit output which is connected to a load.

A preferred embodiment of the current interface circuit of the present invention comprises an operational amplifier, a pair of current mirrors, and circuitry for connecting the current mirrors to an output node. The operational amplifier receives a signal from an input current source and has a feedback connection from its output to the input. The amplifier also has a pair of three terminal, complementary output transistors which are connected at their emitters to the amplifier output. The collectors of each transistor are connected to the controlled leg of respective current mirrors. The controllable leg of each current mirror is connected to an output node of the interface circuit. In an especially preferred embodiment, each controlled leg is connected to the output terminal by means of complementary three terminal transistors having the same geometry as the amplifier output transistors. When a bipolar pair is used, the controllable legs of the respective current mirrors are connected to the emitters of the respective devices, the collectors are connected to each other and to the output node, and the base of each of the transistors is connected to a biasing voltage. These complimentary devices provide compensation for errors caused by base current variations in the complementary bipolar transistor pair used as the output devices in the operational amplifier.

Another preferred embodiment of the current interface circuit of the present invention comprises an operational amplifier having first and second current outputs, and circuitry for connecting these outputs to respective first and second nodes of a differential voltage output. The first current output is connected directly to the first output node, which is also connected by a resistance network to a voltage supply. The second current output is connected to the controlled leg of a current mirror. The controllable leg of the current mirror is connected to the second node of the differential voltage output. This second node of the voltage output is also preferably connected to a voltage source by a resistance network. In an especially preferred embodiment, the controllable leg of the current mirror is connected to the second output node by the main current conducting path of a compensating transistor. The control terminal of the compensating transistor is connected to the control terminal of one of a pair of complementary output devices of the operational amplifier. A second compensating transistor has a main current conducting path connected in series with a current source, and has a control terminal connected to the second current output. The current source is set to supply a current which is equal in magnitude to the quiescent current flowing through the complementary output pair of the operational amplifier. The currents flowing in the control legs of these compensating transitors provide compensation for errors caused by base current variations in the complementary output devices of the operational amplifier.

In the preferred embodiments just described, the impedance at the input node is kept low by the feedback connection from the amplifier output to the negative input. The output devices of the amplifier are both on and conducting the same emitter current under quiescent conditions. When a change in input current occurs, the emitter current through one of the output devices is reduced by an amount which is equal to one-half the magnitude of the change, while the emitter current of the other output device is increased by a like amount. These changes are reflected in the controllable leg of the current mirror or mirrors, which are connected to the output nodes. Respective errors due to the base currents of the amplifier output devices are compensated. The original change in the input current is thus effectively reconstructed at the output node.

DETAILED DESCRIPTION OF THE DRAWINGS

Figure 1:
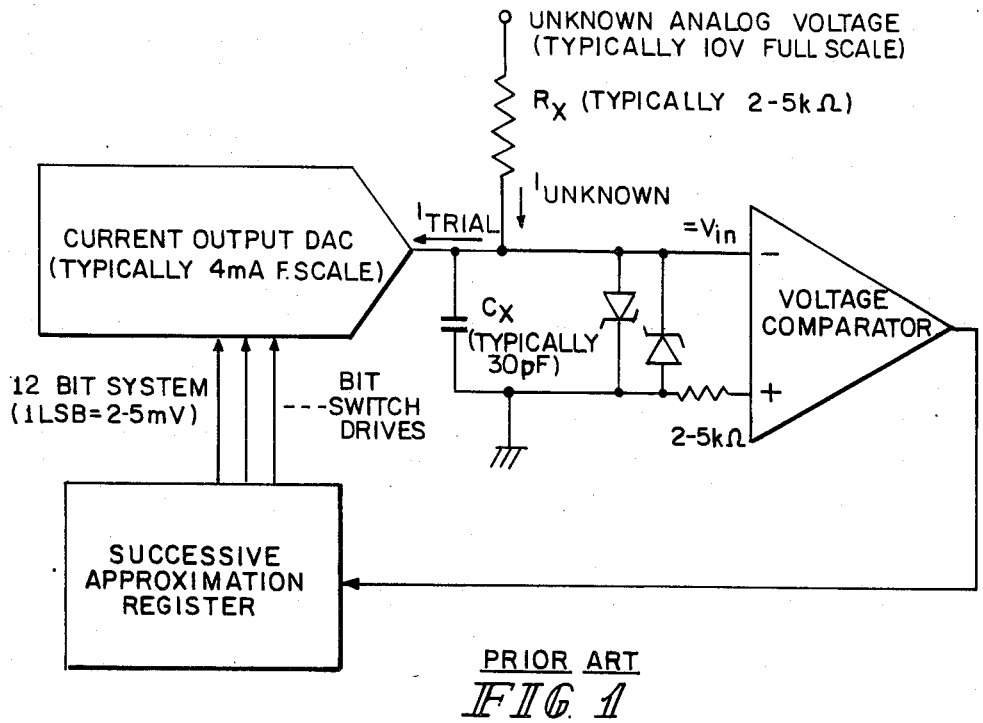
FIG. 1 shows a conventional 12-bit successive approximation A/D converter.
Figure 2:
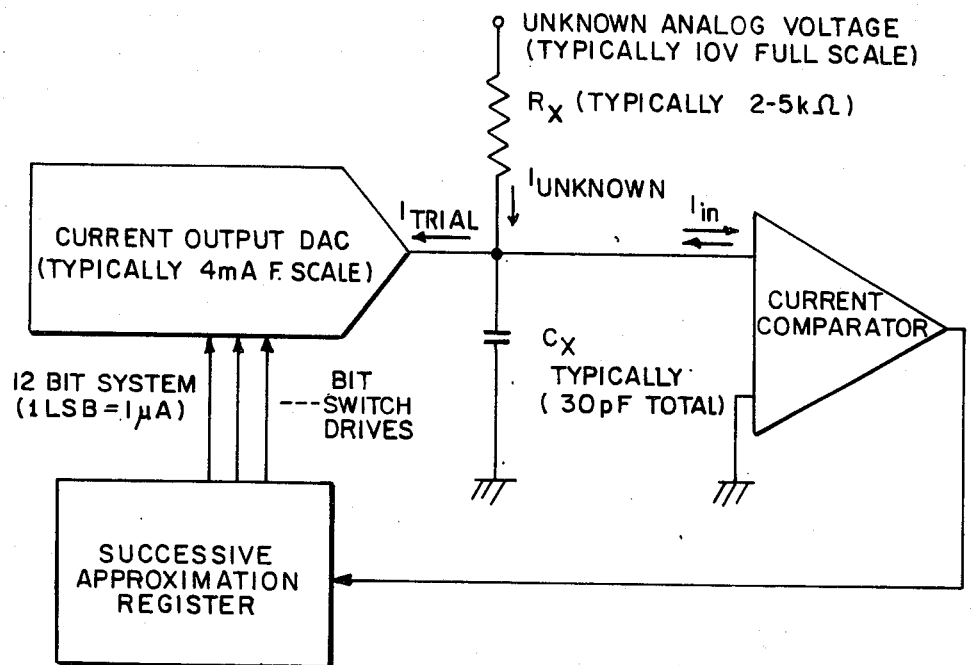
FIG. 2 shows a successive approximation A/D converter using a current comparator.
Figure 3:
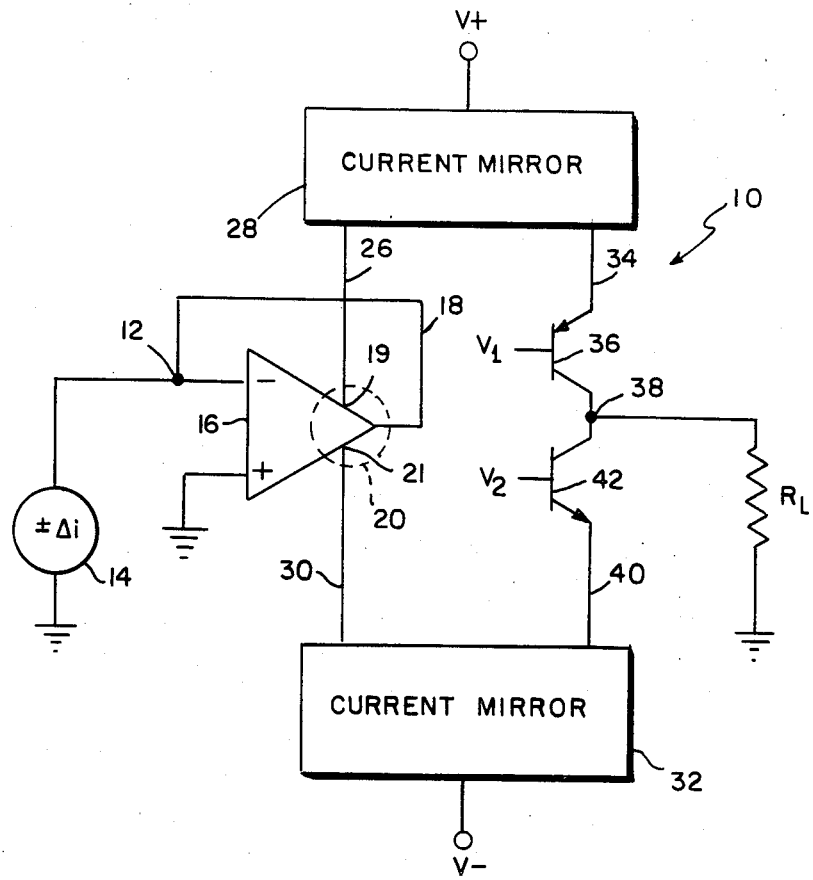
FIG. 3 shows a schematic diagram of an interface circuit according to the present invention.

FIG. 3 shows an interface circuit 10 constructed in accordance with the present invention. Interface circuit 10 has an input node 12 for receiving a current input from current source 14. Input node 12 is connected to the negative input of operational amplifier 16 which, subject to the modifications described in detail below, may be a conventional operational amplifier of known design. The positive input of the operational amplifier is connected to a reference potential, such as ground. The output of the operational amplifier is connected, via feedback line 18, to input node 12. Operational amplifier 16 also has two current outputs 19 and 21 which are connected to controlled legs 26 and 30, respectively, of current mirrors 28 and 32. Current mirrors 28 and 32 are of known types, such as Wilson current mirrors, and have a gain of one in this preferred embodiment. Bipolar or FET current mirrors may be used, depending upon the type of devices used to implement operational amplifier 16 and the remaining circuit components.

In the circuit of FIG. 3, operational amplifier 16 functions as an impedance buffer by maintaining a very low impedance at input node 12, while producing current variations at current outputs 19 and 21 in response to input current variations at node 12. Current mirrors 28 and 32 produce corresponding current variations, via controllable legs 34 and 40, at output node 38. The complementary symmetry of interface circuit 10 allows for detection of positive and negative variations in input current. Thus, the circuit configuration in FIG. 3 provides an interface which can form the input stage of a current comparator which will have a very low input impedance.

Figure 4:
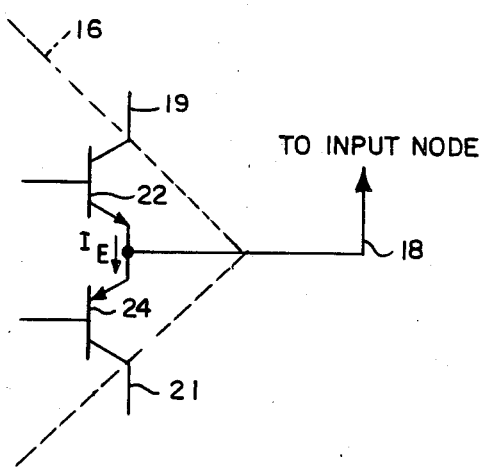
FIG. 4 shows, in additional detail, a portion of the interface circuit of FIG. 3.

The modifications previously referred to are best described with reference to FIG. 4. FIG. 4 shows an enlarged view of a portion of the circuit of FIG. 3 indicated by dashed circle 20 in FIG. 3. With reference to FIG. 4, it can be seen that operational amplifier 16 has a pair of output devices which, in this preferred embodiment, comprise NPN bipolar transistor 22 and PNP bipolar transistor 24. The emitters of transistors 22 and 24 are connected together and to the output of amplifier 16. As previously described, the output of amplifier 16 is also connected to input node 12 via feedback connection 18. The base terminals of transistors 22 and 24 are connected to the conventional circuitry of the operational amplifier. The modification necessary to a conventional operational amplifier used in the present invention involves providing access to the collector terminals of transistors 22 and 24. As shown in FIGS. 3 and 4, the collector terminal of transistor 22 is connected to current output 19 which is, in turn, connected to controlled leg 26 of current mirror 28. Similarly, the collector terminal of transistor 24 is connected to current output 21 which is connected to controlled leg 30 of current mirror 32.

Controllable leg 34 of current mirror 28 is connected, via transistor 36, to output node 38 of interface circuit 10. Controllable leg 40 of current mirror 32 is connected, via transistor 42, to output node 38. In the present embodiment, transistors 36 and 42 are shown as PNP and NPN bipolar transistors, respectively. The base terminals of these transistors are connected to biasing voltages $V_1$ and $V_2$. These transistors provide compensation for base current errors caused by the base currents of output transistors 22 and 24 of operational amplifier 16. If another type of operational amplifier is used (for example, an amplifier having complementary FET output devices), the need for base current compensation may be eliminated. In that case, transistors 36 and 42 may no longer be needed. However, the use of complementary devices of some type is preferred for reasons such as controlling the voltage level on the controllable legs of the current mirrors and for compensating for process variations and environmental conditions.

Output node 38 is connected to a load impedance $R_l$. Although $R_l$ is shown in FIG. 3 as a simple resistor, the load impedance could also be the input impedance to another signal amplifying or processing stage.

The circuit illustrated in FIGS. 3 and 4 operates as follows. When input current source 14 is off, feedback connection 18 forces the negative input of operational amplifier 16 to 0 volts. Output transistors 22 and 24 are both on and conducting the same emitter current. Under these conditions, the impedance as measured looking into the emitters of transistors 22 and 24 is approximately $V_T/2I_E T(f)$ where:

$$V_T = \frac{KT}{q}$$

K = Boltzmans constant
T = Temperature
q = electron charge
$I_E$ = the emitter current of transistors 22 and 24
T(f) = the loop gain of the amplifier as a function of frequency.

To find the current at output node 38 under quiescent conditions, a current $I_E$ at the emitters of transistors 22 and 24 is assumed. It is also assumed that there are no beta or $V_A$ (Early voltage) mismatches in the corresponding transistor pairs, that the input bias current of amplifier 16 is internally compensated, that current mirrors 28 and 32 are ideal current mirrors with a gain of one, and that bias voltages $V_1$ and $V_2$ are symmetrical with respect to the potential at node 38. The output current is then defined as:

$$I_0 = (I_E - i_{b22} - i_{b36}) - (I_E - i_{b24} - i_{b42}) = 0$$

In the presence of an input signal current ($\pm\Delta i$), the negative input of operational amplifier 16, and thus input node 12, is held at 0 volts and the input signal current is split between the two paths of equal impedance through transistors 22 and 24. For an input signal current of $+\Delta i$, the emitter current of transistor 22 is reduced by $\Delta i/2$ and the emitter current of transistor 24 is increased by $\Delta i/2$. The currents at the collecters of transistors 22 and 24 change in corresponding manner. However, a source of error is introduced due to the resulting change in base currents of these transistors. For low level input currents, this error may be significant. These changes are reflected, via current mirrors 28 and 32, in the respective emitter currents of transistors 36 and 42. Transistors 36 and 42 are matching devices which are identical in geometries and characteristics, to transistors 22 and 24, respectively but which are of opposite conductivity types.. The biasing voltages, $V_1$ and $V_2$ are set such that the base currents of transistors 36 and 42 are equal but opposite in polarity to the base currents of transistors 22 and 24. Thus, the input signal current is effectively reconstructed at output node 38 and the errors introduced by the base currents of output transistors 22 and 24 are compensated.

As noted previously, biasing voltages $V_1$ and $V_2$ are symmetrical with respect to output node 38. Factors to be considered in selecting levels for $V_1$ and $V_2$ include the desired voltage levels at legs 34 and 40 of current mirrors 28 and 32, and the magnitudes of the expected voltage excursions at output node 38. If the voltage at output node 38 exceeds $V_1$ and $V_2$, circuit operation will be disrupted. Biasing voltages $V_1$ and $V_2$ may be taken from points internal to operational amplifier 16. As previously noted, the design of the operational amplifier is conventional, with the exception of the modifications discussed above. Thus, the detailed circuitry of operational amplifier 16 is not shown. The present invention will preferably be implemented in monolithic, integrated circuit form, rather than with discreet components. Thus, access to the collector terminals of transistors 22 and 24 will be readily available. If desired, a special purpose circuit could be designed as a functional equivalent to operational amplifier 16.

Figure 5:
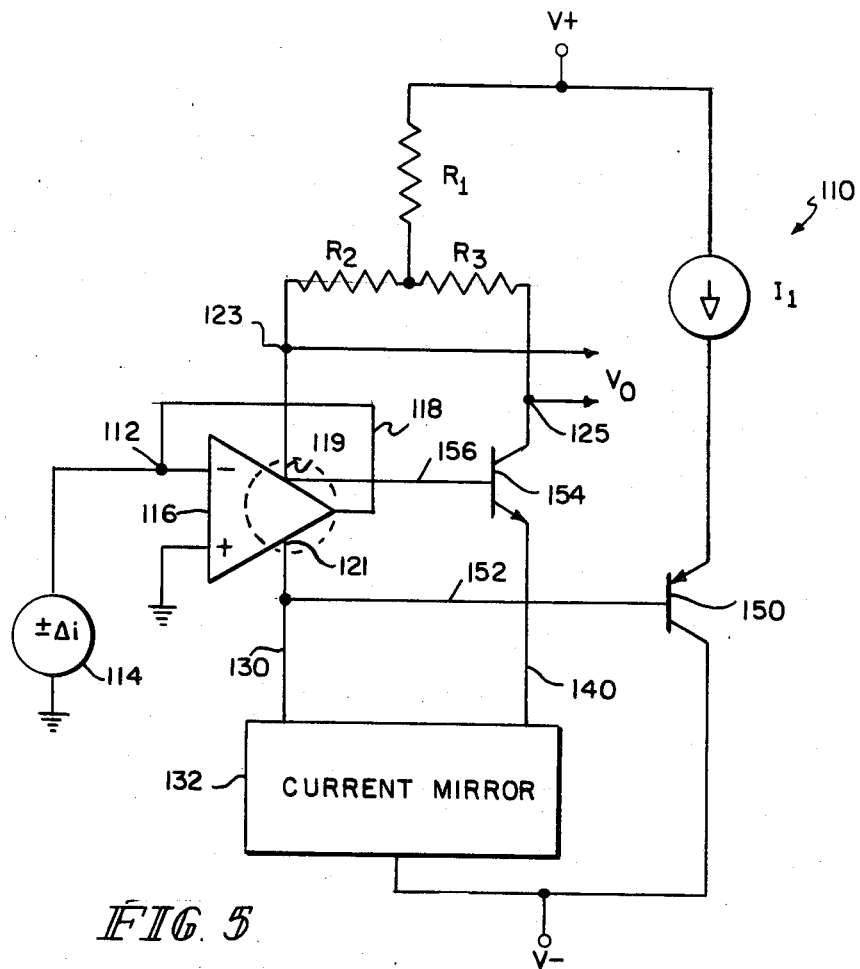
FIG. 5 shows a schematic diagram of another embodiment of the interface curcuit of the present invention.
Figure 6:
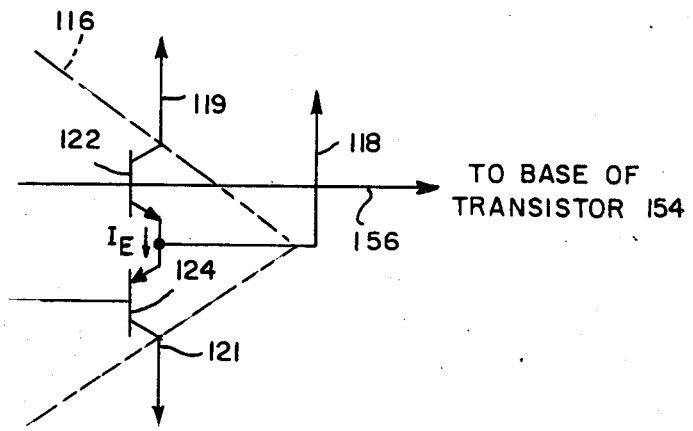
FIG. 6 shows, in additional detail, a portion of the interface circuit of FIG. 5.

Another preferred embodiment of the present invention is shown in FIGS. 5 and 6. Interface circuit 110 in FIG. 5 has an input node 112 for receiving a signal current input from current source 114. As in the circuit shown in FIG. 3 above, input node 112 is connected to the negative input of operational amplifier 116. The positive input of the operational amplifier is connected to a reference potential, and the output of the operational amplifier is connected, via feedback line 118 to input node 112. As also occurs in the circuit of FIG. 3, operational amplifier 116 functions as an impedance buffer by maintaining a very low impedance at input node 112, while producing current variations at current outputs 119 and 121 which correspond to input current variations at node 112. Outputs 119 and 121 are connected to respective collector terminals of a pair of complementary output transistors 122 and 124 which, with the exception of the control leg of transistor 122, are connected and operate in the same fashion as transistors 22 and 24 of FIG. 4.

Unlike the circuit of FIG. 3, interface 110 in FIG. 5 has a differential voltage output $V_0$ which is connected between two output nodes 123 and 125. Output node 123 is connected directly to current output 119 (i.e., the collector of transitor 122), and to one end of a resistor $R_2$. The other end of resistor $R_2$ is connected to a voltage supply by a level shifting resistor $R_1$. Current output 121 is connected to controlled leg 130 of current mirror 132 and to the control terminal of transistor 150, via line 152. Controllable leg 140 of current mirror 132 is connected to output node 125 by the main current conducting path of transistor 154. As illustrated in FIG. 6, the control terminal (i.e., the base) of transistor 154 is connected to the control terminal of transistor 122, via line 156. Output terminal 125 is also connected to one side of resistor $R_3$. The other side of resistor of $R_3$ is connected to the voltage supply by level shifting resistor $R_1$. The main current conducting path of transistor 150 is serially connected between the voltage supply terminals with a current source $I_1$.

The circuit of FIG. 5 operates as follows. Under quiescent conditions (i.e., with input current source 114 off), transistors 122 and 124 are both on and conducting the same emitter current. The collector current of transistor 122 causes a voltage drop across resistor $R_2$, resulting in a first voltage level at voltage output 123. The collector current of transistor 124 is reflected to controllable leg 140 of current mirror 132 and causes a voltage drop across resistor $R_3$ resulting in the presence of a voltage level at output node 125. The voltage drops across resistors $R_2$ and $R_3$ will be approximately equal in magnitude and polarity, so that the combined differential voltage drop $V_0$ between nodes 123 and 125 will be approximately equal to zero. It should be noted that resistor $R_1$ is provided for level shifting purposes only and can be replaced by any component or components which accomplish the same function.

As explained with reference to circuit 10 in FIG. 3, the presence of an input signal current ($\pm\Delta i$) will result in a division of input signal current between the two paths of equal impedance looking into the emitters of transistors 122 and 124. For example, a positive input current signal $+\Delta i$ will cause an increase of $\Delta i/2$ in the collector current of transistor 124 and a corresponding decrease in the collector current of transistor 122. The collector current of transistor 124 is mirrored to resistor $R_3$ by current mirror 132 (which is assumed to be ideal). Thus, a differential voltage will appear across output nodes 123 and 125 as a result of the input current flow $+\Delta i$. If resistors $R_2$ and $R_3$ are the same size, the respective increase and decrease of current through each will result in equal but opposite voltage drops across each resistor, and in a differential voltage $V_0$ of approximately twice the voltage drop across either resistor. Thus, the magnitude of the resulting $V_0$ is the same as it would be if the full signal current $+\Delta i$ were flowing through either resistor alone.

The same result occurs for negative input current signals. The magnitude and polarity of the voltage difference between nodes 123 and 125 vary in correspondence with the magnitude and polarity of the input current signal.

As with the circuit of FIG. 3, a source of error in circuit 110 is introduced by the base currents of transistors 122 and 124. For high precision applications, compensation for these errors is desired. In the circuit of FIG. 5, transistors 150 and 154 are provided for this purpose. Transistor 150 is connected between the terminals of the voltage supply and in series with a current source $I_1$. The current flowing from source $I_1$ is set to match the quiescent current flowing through transistors 122 and 124. With reference to transistor 124, the current flowing in the collector leg of this device is equal to the emitter current minus the current flowing out of the base. The current flowing out of the base of transistor 150 is approximately equal to the base current of transistor 124, since these two devices are matched and similarly biased. Thus, the current flowing into controlled leg 130 of current mirror 132 is effectively equal to the emitter current of transistor 124. This current is reflected to the emitter of transistor 154 by current mirror 132. The current flowing through resistor $R_2$ is the collector current of transistor 122 (i.e., the emitter current minus the base current of transistor 122). The current flowing through resistor $R_3$ is the collector current of transistor 154 (i.e., the emitter current minus the base current of transistor 154). If transistors 122 and 154 are a matched pair, the contributions to the voltage drops across $R_2$ and $R_3$ caused by the respective base currents of transistors 122 and 154 will cancel, thus, compensating for this source of error.

Although the present invention has been explained with reference to specific embodiments, it is to be clearly understood that the scope of the present invention is not to be so limited. Rather, the scope and spirit of the present invention is to be limited only by the terms of the appended claims.

What is claimed is:

1. A current interface circuit, comprising:
   an input mode for receiving an input current flow from a current source;
   a circuit output;
   an impedance buffering circuit connected to the input node and having means for maintaining a low impedance at the input node and having first and second current outputs and having first circuit means for producing a change in a current flow at said first current output and at said second current output in response to a change in magnitude of said input current flow; and
   second circuit means, connected to said first and second current outputs and to said circuit output, for producing a change in current flow at the circuit output in response to said current flow changes at said first and second outputs;
   wherein said second circuit means includes a first current mirror having a controlled leg connected to said first current output and a controllable leg connected to the circuit output, and a second current mirror having a controlled leg connected to said second current output and a controllable leg connected to the circuit output;
   wherein said controllable legs are connected to the circuit by respective complementary conductivity transistor devices, each device having a first terminal connected to the controllable leg of the respective current mirrors, a second terminal connected to the circuit output, and a control terminal connected to a biasing voltage.

2. A current interface circuit according to claim 1, wherein said second circuit means includes means for compensating the current flow at the circuit output for errors caused by said impedance buffering circuit.

3. A current interface circuit according to claim 2, wherein said second circuit means includes current mirror means for producing said change in current flow at the circuit output.

4. A current interface circuit according to claim 3, wherein said current mirror means has a gain of one.

5. A current interface circuit according to claim 1, wherein said first circuit means produces current flow changes of equal magnitudes at said first and second current outputs.

6. A current interface circuit according to claim 1, wherein said complementary conductivity transistor devices are matched to a pair of complementary conductivity transistor output devices in said impedance buffering circuit, but are of opposite respective conductivity types, each of said complementary output devices having respective first terminals connected together at a common node, and each device having a second terminal connected, respectively, to the first and second current outputs, and each device having a third terminal connected to said first circuit means.

7. A current interface circuit comprising:
   an input node for receiving an input current flow from a current source;
   a circuit output;
   an impedance buffering circuit connected to the input node and having means for maintaining a low impedance at the input node and having first and second current outputs and having first circuit means for producing a change in a current flow at said first current output and at said second current output in response to a change in magnitude of said input current flow; and
   second circuit means, connected to said first and second current outputs and to said circuit output, for producing a change in current flow at the circuit output in response to said current flow changes at said first and second outputs, wherein said impedance buffering circuit includes a pair of complementary conductivity transistor output devices, each device having respective first terminals connected together at a common node, and each device having a second terminal connected, respectively, to the first and second current outputs, and each device having a third terminal connected to said first circuit means, and wherein said first circuit means includes feedback means connected between said common node and said input node.

8. A current interface circuit according to claim 7, wherein said output devices are PNP and NPN bipolar transistors having respective emitters connected to the common node, and having respective collectors connected to the first and second outputs, respectively, and having respective bases connected to said first circuit means.

9. A current interface circuit according to claim 7, wherein said second circuit means includes a first current mirror having a controlled leg connected to said first current output and a controllable leg connected to the circuit output, and a second current mirror having a controlled leg connected to said second current output and a controllable leg connected to the circuit output.

10. A current interface circuit according to claim 9, wherein said controllable legs are connected to the circuit output by respective complementary conductivity transistor devices, each device having a first terminal connected to the controllable leg of the respective current mirrors, a second terminal connected to the circuit output, and a control terminal connected to a biasing voltage.

11. A current interface circuit according to claim 10, wherein said complementary conductivity transistor devices are matched to a pair of complementary conductivity transistor output devices in said impedance buffering circuit, but are of opposite respective conductivity types, each of said complementary output devices having respective first terminals connected together at a common node, and each device having a second terminal connected, respectively, to the first and second current outputs, and each device having a third terminal connected to said first circuit means.

12. A current interface circuit, comprising:
an operational amplifier having a first input for receiving a signal from an input current source, a second input connected to a reference voltage, an amplifer output, a feedback connection from the amplifier output to the first input, and a pair of three-terminal, complementary conductivity transistor output devices, said output devices having main current conducting paths which are serially connected and which are defined by respective first and second terminals, said first terminals being connected together at the amplifier output;
first and second current mirrors, each current mirror having a controlled leg connected to a respective second terminal of said output devices, and each current mirror having a controllable leg; and
circuit means for connecting the controllable legs of the current mirrors to an output node.

13. A current interface circuit according to claim 12, wherein said circuit means includes means for compensating a current flow at the output node for errors caused by said three-terminal output devices.

14. A current interface circuit according to claim 12, wherein said circuit means includes a pair of three-terminal, complementary conductivity transistor devices having respective first terminals connected to respective controllable legs of the first and second current mirrors, and having second terminals connected together at the output node, and having control terminals connected to respective biasing voltages.

15. A current interface circuit according to claim 14, wherein said three-terminal, complementary conductivity transistor output devices and said three-terminal complementary conductivity transistor devices in said circuit means are matched, but are of opposite respective conductivity types.

16. A current interface circuit, comprising:
an input node for receiving an input current flow from a current source;
a differential voltage output having first and second output nodes;
an impedance buffering circuit connected to the input node and having means for maintaining a low impedance at the input node and having first and second current outputs and having a first circuit means for producing a change in current flow at said first current output and at said second current output in response to a change in magnitude of said input current flow;
second circuit means for connecting said first current output to said first output node and for producing a voltage change at said first output node in response to said change in current flow at said first current output; and
third circuit means for connecting said second current output to said second output node and for producing a voltage change at said second output node in response to said change in current flow at said second current output.

17. A current interface circuit according to claim 16, wherein said impedance buffering circuit comprises an operational amplifier having a first input connected to said input node, a second input connected to a reference voltage, an amplifier output connected by a feedback means to the first input, and a pair of complementary conductivity transistor output devices having first terminals connected together and to said amplifier output, second terminals connected, respectively, to said first and second current outputs, and control terminals connected to bias points within the amplifier.

18. A current interface circuit according to claim 17, wherein said second and third circuit means include means for compensating for errors, due to biasing currents flowing in the control terminals of said complementary conductivity transistor output devices, in said changes in current flows at said first and second current outputs.

19. A current interface circuit according to claim 18, wherein said means for compensating includes a first and second compensating transistors having main current conducting paths connected to respective sources of current and having control terminals, wherein the control terminal of said first compensating transistor is connected to the control terminal of one of said pair of complementary conductivity transistor output devices, and wherein the control terminal of said second compensating transistor is connected to the second terminal of the other of said pair of complementary conductivity transistor output devices.

20. A current interface circuit according to claim 19, wherein the main current conducting path of the first compensating transistor is connected in series between the second output node and a controllable leg of a current mirror, said current mirror having a controlled leg connected to said second current output of said impedance buffering circuit.

21. A current interface circuit according to claim 20, wherein the main current conducting path of the second compensating transistor is connected in series with a current source which supplies a current equal in magnitude to a quiescent current flow in said complementary conductivity transistor output devices.

22. A current interface circuit according to claim 19, wherein the main current conducting path of a least one of said first and second compensating transistors is connected in series with a current source which supplies a current equal in magnitude to a quiescent current flow in said complementary conductivity transistor output devices.

23. A current interface circuit according to claim 19, wherein said compensating transistors and said complementary conductivity transistor output devices are matched transistors.

24. A current interface circuit according to claim 16, wherein said voltage changes at said first and second output nodes are equal in magnitude, but are of opposite polarity.

25. A current interface circuit according to claim 16, wherein said second circuit means includes resistance means connected between said first output node and a voltage source.

26. A current interface circuit according to claim 25, wherein said third circuit means includes a current mirror amplifier having a controlled leg connected to said second current output, and having a controllable leg connected to said second output node.

27. A current interface circuit according to claim 26, wherein said third circuit means further includes resistance means connected between said second output node and a voltage source.

28. A current interface circuit according to claim 26, wherein said controllable leg of the current mirror amplifier is connected to the second current output by a main current conducting path of a compensating transistor, and wherein a control terminal of said compensating transistor is connected to said first circuit means in said impedance buffering circuit.

29. A current interface circuit according to claim 16, wherein said third circuit means includes a current mirror amplifier having a controlled leg connected to said second current output, and having a controllable leg connected to said second output node.

30. A current interface circuit according to claim 16, wherein said third circuit means further includes resistance means connected between said second output node and a voltage source.

31. A current interface circuit according to claim 29, wherein said controllable leg of the current mirror amplifier is connected to the second current output by a main current conducting path of a compensating transistor, and wherein a control terminal of said compensating transistor is connected to said first circuit means in said impedance buffering circuit.

* * * * *